(12) United States Patent
Endo et al.

(10) Patent No.: US 6,283,323 B1
(45) Date of Patent: Sep. 4, 2001

(54) ELECTRONIC COMPONENT SUPPLY DEVICE

(75) Inventors: Tadashi Endo; Takao Kashiwazaki; Shuichi Kubota; Koji Okawa, all of Yamanashi; Masato Tanino, Kofu; Akira Kabeshita, Hirakata, all of (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/469,539

(22) Filed: Dec. 22, 1999

(30) Foreign Application Priority Data

Jan. 14, 1999 (JP) .................................................. 11-007514

(51) Int. Cl.[7] ...................................................... B65H 5/28
(52) U.S. Cl. .......................................... 221/71; 242/608.6
(58) Field of Search .................................. 221/25, 26, 71, 221/72, 69, 70, 89, 191, 195; 242/608, 608.2, 608.6

(56) References Cited

U.S. PATENT DOCUMENTS 5,065,894 * 11/1991 Garland .................................. 221/71
5,114,089    5/1992 Posso .
5,562,384 * 10/1996 Aluite et al. ............................ 221/71

FOREIGN PATENT DOCUMENTS 3441445    5/1985 (DE) .
0273511    7/1988 (EP) .

* cited by examiner

*Primary Examiner*—Kenneth W. Noland
(74) *Attorney, Agent, or Firm*—Jordan and Haqmburg LLP

(57) ABSTRACT

A receiving reel 10 comprises a receiving ratchet 11 and a detachable receiving cap 12 that is set in the receiving ratchet 11 and on which a covering tape 1c is wound, and is provided with contact members 13 and 14 that are provided on the area of engagement of the receiving cap 12 and the receiving ratchet 11. The contact members make contact in the direction of rotation and prevent the receiving cap 12 from coming loose. Mutually contacting concave and convex members 15 and 16 are provided on the contact surfaces along the direction of rotation of the contact members 13 and 14 to make it simple to detach the receiving cap 12 and to prevent it from coming loose and falling off.

4 Claims, 4 Drawing Sheets

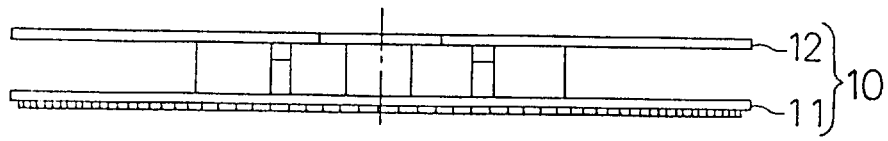
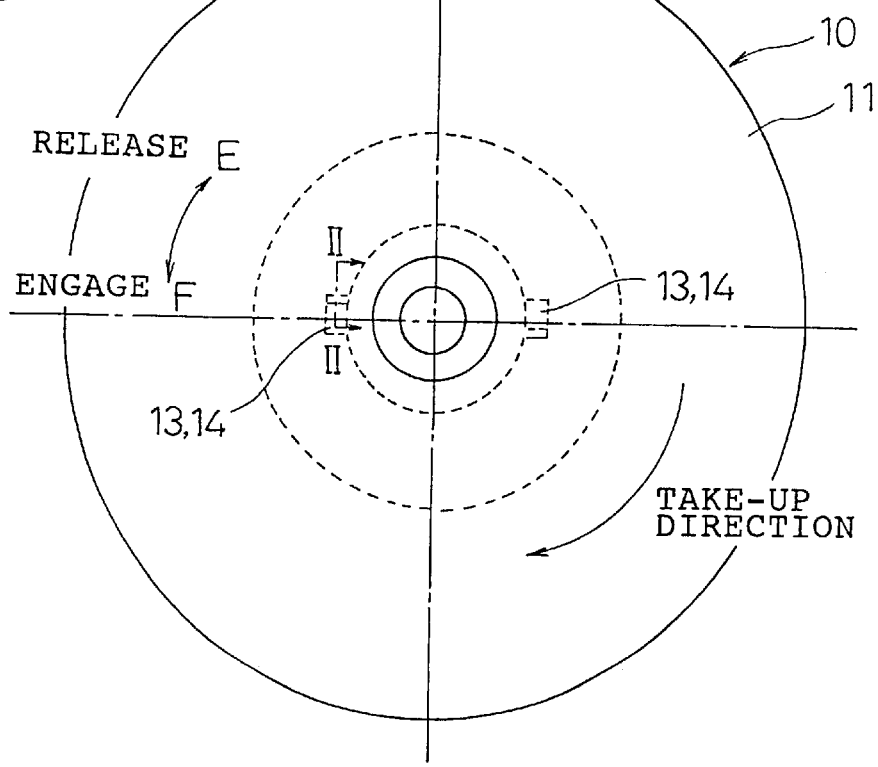
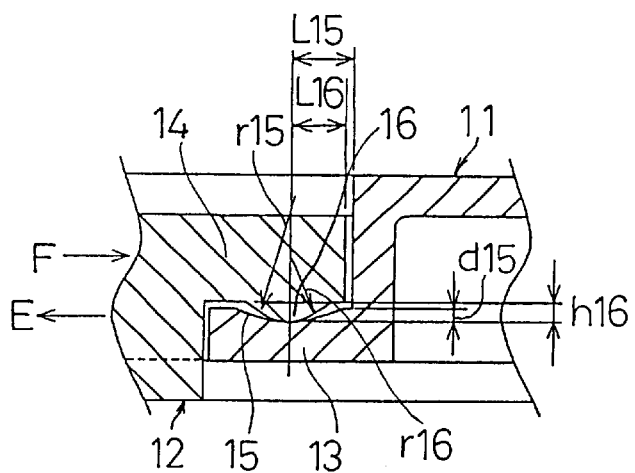

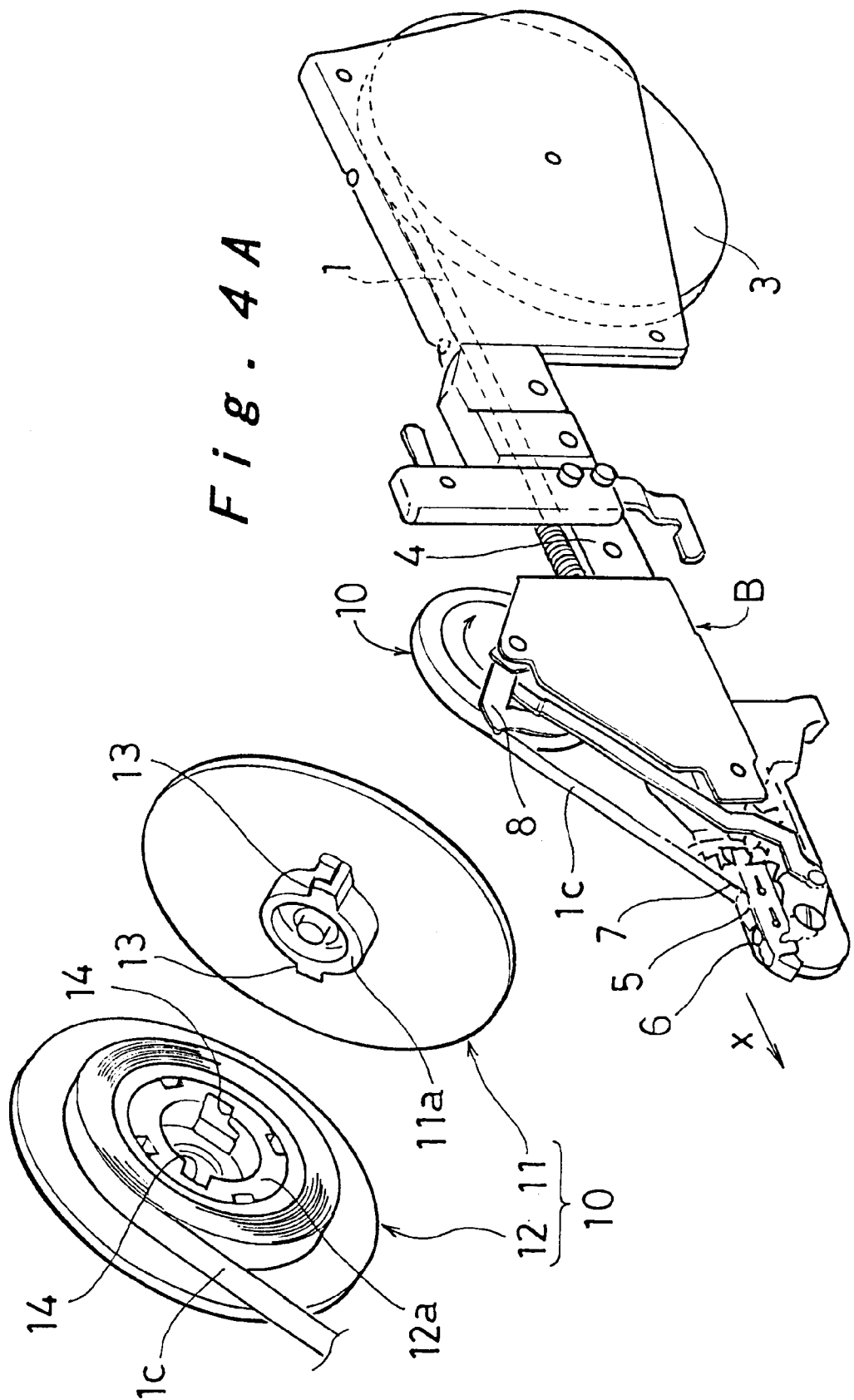

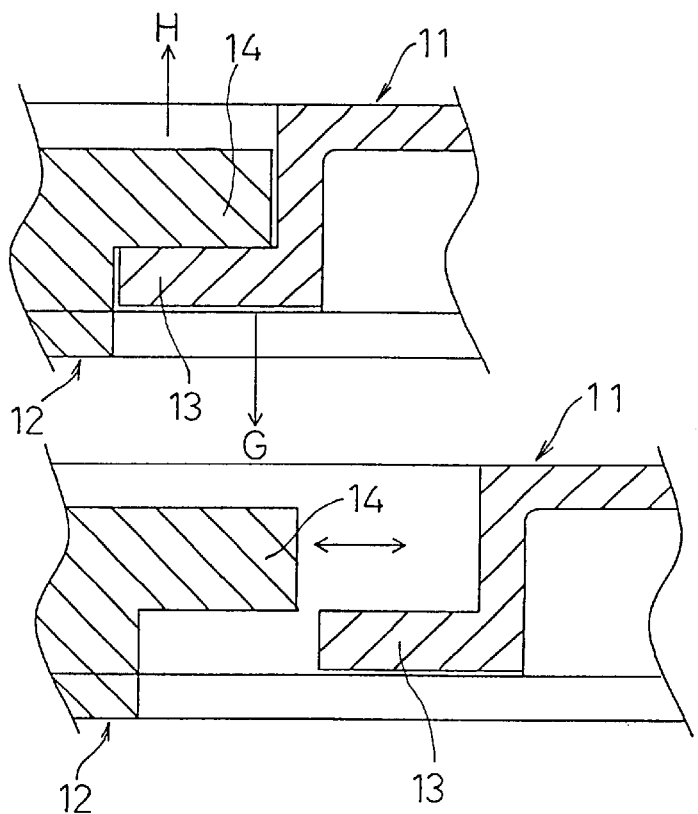
Prior Art
Fig. 5A
Fig. 5B
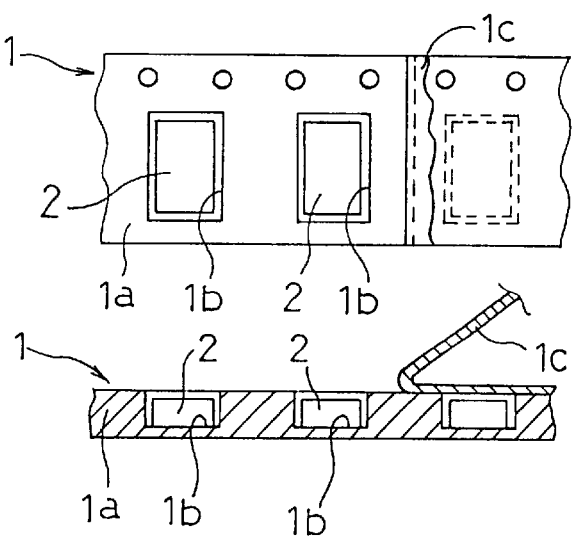
Prior Art
Fig. 6A
Fig. 6B

ELECTRONIC COMPONENT SUPPLY DEVICE

BACKGROUND OF THE INVENTION

The present invention relates to an electronic component supply device that conveys a taping component having a carrier tape, which holds electronic components in holding cavities at a specified pitch, while a covering tape that covers the carrier tape is peeled away by a peeling member to allow the electronic components to be removed at a component removal location, and more particularly to an improvement for a winding unit on which the peeled covering tape is wound.

FIGS. 4 through 6 are used to describe a conventional electronic component supply device. FIG. 6 shows a taping component 1 having a carrier tape 1a formed with holding cavities 1b at a specified pitch in which hold electronic components 2, and a covering tape 1c that prevents the electronic components 2, which can be removed from the surface of the carrier tape 1a, from coming out of the holding cavities 1b.

FIG. 4A shows the taping component 1 wound around a reel 3 and in such a state is fitted in the base portion of a component supply device B. From this state the taping component 1 is conveyed in the direction of arrow x along a conveying surface provided in a component supply guide 4 of the component supply device B while the electronic components 2 of the holding cavities 1b are positioned successively at a component removal opening 6 provided in a hold-down cover 5 placed on the front end of the conveying surface. At a point during the conveyance of the taping component 1 the covering tape 1c is peeled away from the carrier tape 1a via a peeling slot 7 provided in the hold-down cover 5, and the peeled covering tape 1c is wound onto a receiving reel 10. As a result, the covering tape 1c is peeled and the carrier tape 1a is conveyed with the holding cavities 1b exposed while the electronic components 2 are removed via the component removal opening 6.

FIG. 4B shows a take-up reel 10 having a receiving ratchet 11, which is moved in only one direction by the reciprocating action of a feed lever 8 arranged at the rear of the hold-down cover 5, and a removable receiving cap 12 That is set in the take-up ratchet 11. This arrangement winds the covering tape 1c onto the receiving cap 12.

FIG. 4B shows a cylindrical support shaft 11a, which protrudes from the center of the receiving ratchet 11, and a cylindrical installation member 1 2a. which protrudes from the center of the receiving cap 12, that engages over the outer circumference of the cylindrical support shaft 11a. The engagement area between the cylindrical support shaft 11a and the cylindrical installation member 12a is provided with contact members 13 and 14 in two locations that prevent separation from the receiving cap 12 and that contact the receiving ratchet 11 in the direction of rotation.

The work of resetting the taping component 1 in the above arrangement when the components run out, or for another reason, is described hereafter. As shown in FIG. 5B, turning the receiving cap 12, on which is wound the covering tape 1c, at a specified angle of rotation in the direction of rotation of the receiving ratchet 11 causes the contact member 14 to slide in the E direction and the contact members 13 and 14 to release their contact allowing the receiving cap 12 to be removed. As shown in FIG. 5A, when installing the receiving cap 12, the receiving cap 12 is inserted into the receiving ratchet 11 and rotated in the direction opposite to the direction of rotation of the receiving ratchet 11 to cause the contact member 14 to slide in the F direction and the contact members 13 and 14 to make mutual contact. At this time the contact members 13 and 14 are arranged such that they both are respectively slightly elastically deformed in the H and G directions shown in FIG. 5A.

In the above conventional arrangement, however, the contact surface that follows in the direction of rotation of the contact members 13 and 14 is arranged to be flat, which causes the entirety of the receiving cap 12 to be slightly tilted in relation to the receiving ratchet 11 by the tensile force of the covering tape 1c, which causes an even greater elastic deformation in the contact members 13 and 14. This creates an even tighter contact between the contact members 13 and 14, which causes a problem in that it makes detachment by hand difficult.

Further, since the amounts of elastic deformation of the contact members 13 and 14 are unequal, when the amount of elastic deformation is small or less than zero there is no holding force, which creates the problem of the receiving cap 12 coming loose and falling off the receiving ratchet 11.

SUMMARY OF THE INVENTION

With The foregoing drawbacks of prior art in view, it is an object of the present invention to provide an electronic component supply device that can effect an increase in workability by making it simple to detach a receiving cap from a receiving ratchet while preventing the receiving cap from coming loose and falling off.

The electronic component supply device of the present invention comprises a Taping component in which electronic components are accommodated in holding cavities formed at a specified pitch on a carrier tape whose surface is covered by a removable covering tape, and which is conveyed along a conveying surface by the reciprocating action of a feed lever while the covering tape is peeled by a peeling member and the electronic components are removed from the holding cavities at a component removal location. A receiving reel that receiving the covering tape removed by the peeling member comprises a receiving ratchet, which is only rotated in one direction by the reciprocating action of a feed lever, and a receiving cap on which the covering tape is wound and which can be removed from the receiving ratchet. Contact members are provided that prevent the receiving cap from coming loose in an area of engagement of the above-mentioned receiving ratchet and that make contact in the direction of rotation and which have on their surfaces convex and concave shapes that make mutual contact along their direction of rotation. Providing convex and concave shapes on the contact surface along the contact member direction of rotation reduces the contact area when the contact members are caused to slide and the receiving cap is detached from the receiving ratchet, and reduces the amount of elastic deformation of the contact members when the entire receiving cap is slightly tilted and fixed in relation to the receiving ratchet by the tensile force of the covering tape, which allows simple removal and installation by hand. Further, because the amount of elastic deformation when the contact members are slid and detached does not become zero or less, and because the contact members can only be turned and detached when the applied force exceeds the force of friction of the mutually contacting convex and concave shapes, the receiving cap does not come loose from the receiving ratchet and fall off, While novel features of the invention are set forth in the preceding, the invention, both as to organization and content, can be further understood and appreciated, along with other objects and features thereof, from the following detailed description and examples when taken in conjunction with the attached drawings.

BRIEF DESCRIPTION OF THE DRAWINGS

FIG. 1A is a plan view and FIG. 1B is a front view of a receiving reel of an electronic component supply device of the present invention;

FIG. 2 is an enlarged section view at view II—II in FIG. 1B;

FIG. 4A is a complete perspective view of an arrangement of an electronic component supply device, and FIG. 4B is a partial perspective view of a receiving reel on which a covering tape is wound;

FIG. 5A is a section view of the engaged state and FIG. 5B is a section view of the detached state showing the engagement members of the receiving ratchet and receiving cap of a conventional receiving reel; and FIG. 6A is a plan view and FIG. 6B is a section view showing a taping component handled by the electronic component supply device.

DESCRIPTION OF PREFERRED EMBODIMENTS

Figure 3A:
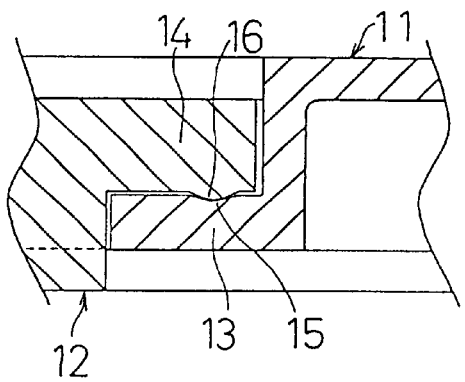
FIG. 3 uses the same section view as FIG. 2 to show the construction of other arrangements of the same embodiment.

A first embodiment of the present invention is described with reference to FIG. 1 through FIG. 3. the overall arrangement of the electronic component supply device is substantially the same as the example of a conventional device described with reference to FIG. 4 through 6, and will be described using same reference numerals.

As shown in FIG. 4A, the electronic component supply device B of this aspect of the embodiment conveys a taping component 1 along the conveying surface of a component supply guide 4 in the conveyance direction (arrow X direction) and the taping component 1 is pressed against the conveying surface of the component supply guide 4 by a U-shaped hold-down cover 5. A covering tape 1c is peeled off of the conveyed taping component 1 by a peeling slot 7 provided in the holddown cover 5. the peeled covering tape 1c is wound onto a receiving reel 10.

As shown in FIG. 1A, 1B, and FIG. 4B, the receiving reel 10 includes a receiving ratchet 11, which is rotated in only one direction by the reciprocating action of a feed lever 8, and a removable receiving cap 12 that is set in the receiving ratchet 11 and on which the covering tape 1c is wound. A cylindrical support shaft 11 protrudes from the center of the receiving ratchet 11, and a cylindrical installation member 12a protrudes from the center of the receiving cap 12 and engages over the outer circumference of the cylindrical support shaft 11a. The cylindrical support shaft 11a and the cylindrical installation member 12a are provided with contact members 13 and 14 that are positioned in two locations on the diameter of the engagement area to prevent the receiving cap 12 from coming loose and that make contact in the direction of rotation of the receiving ratchet 11 Thus, the receiving cap 12 is caused to rotate a specified amount in the direction of rotation of the receiving ratchet 11, and the receiving cap 12 can be removed from the receiving ratchet 11 by sliding contact members 13 and 14.

As shown in FIG. 2, the contact surface along the direction of rotation of the receiving reel 10 of the abovementioned contact members 13 and 14 are provided with a concave member 15 and a convex member 16 that make mutual contact. In other words, the concave member 16 having a radius of r16 is provided at a distance L16 and a height h16 from the end of the contact member 14 and the opposing contact member 13 is provided with a convex member 15 having a depth d15 and radius r15 and being positioned at a distance of L15 from the base surface such it can correctly receive the concave member 16.

In the above arrangement the covering tape 1c that is being received by the receiving reel 10 must be removed from the receiving reel 10 when the taping component 1 is replaced. To do this, the receiving cap 12 is fined in the direction of rotation of the receiving ratchet 11 causing the contact member 14 to slide, releasing contact members 13 and 14 allowing the receiving cap 12 to come loose from the receiving ratchet 11. At this time, the receiving cap 12 can be easily removed and installed by hand because the mutually contacting concave member 15 ad convex member 16 have been provided on contact members 13 and 14, the contact surface area of both members is reduced and the amount of elastic deformation of the contact members 13 and 14 is reduced even if the entire receiving cap 12 is tilted an fix in relation to the receiving ratchet 11 by the tensile force of the covering tape 1c, Further, by providing the mutually contacting concave member 15 and the convex member 16, the amount of elastic deformation when the contact members 13 and 14 are slid and removed does not become zero or less and rotation is only effected when the acting force exceeds the force of resistance of the concave member 15 and convex member 16, so there is no danger that the receiving cap 12 will come loose from the receiving ratchet 11 and fall off.

Figure 3B:
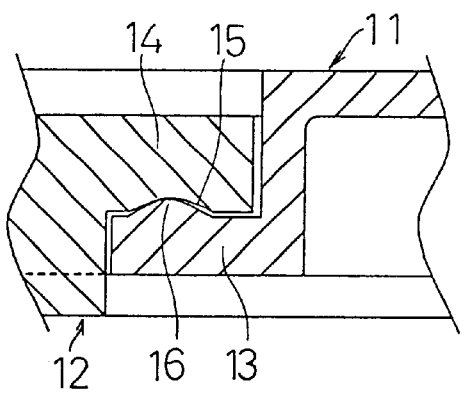
Figure 3C:
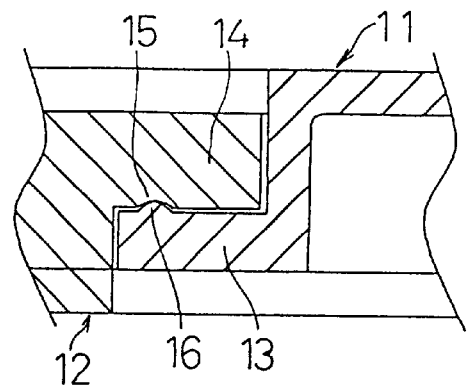

The shapes of the concave and convex members 15 and 16 that are provided on the contact members 13 and 14 are not restricted to those shown in FIG. 2. For example, the size of the concave member 15 and convex member 16 can be changed as shown in FIG. 3A, the concave member 15 can be provided on the contact member 14 and the convex member 16 can be provided on the contact member 13 as shown in FIG. 3B, or the concave member 15 can be provided on the contact member 14 and the convex member 16 can be provided on the contact member 13 and their sizes changed as shown in FIG. 3C. The convex and concave shapes can include a boss and a dent.

Figure 3D:
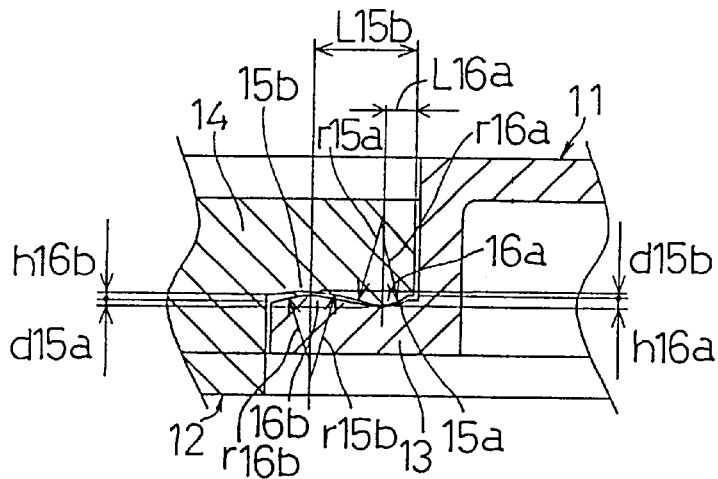

Further, as shown in FIG. 3D, a convex member 16a having a height h16a and radius r16a and positioned at a distance L16a from the end of the contact member 14 and a concave member 15b having a depth d15b and radius r15b and positioned at a distance L15b from the end of contact member 14, and a concave member 15a, which correctly receives the abovementioned convex member 16a, and a convex member 16b, which correctly receives the concave member 15b can be provided to further increase the effect.

In the above description of the aspect of the embodiment, the distances L15, L16, L16a, L15b; heights h16, h16a, depths d15, d15a, d15b; and radiuses r15, r16, r15a, r15b, r16a, and r16b were freely specified, but it is preferred that they be respectively set within the following range taking into consideration the receiving width of the receiving cap 12, which is determined by the width of the covering tape 1c, and the diameter of the engagement hole. For distances L15 and L16: 0.5 to 4.0 mm; for distance L16a: 0.5 to 3.0 mm; for distance L15b: 1.5 to 4.0 mm; for heights h16, b16a, h16b, and depths d15, d15a, d15b: 0.1 to 1.5 mm; for radiuses r15, r16, r15b, r16b; 0.1 to 6.0 mm; and for radiuses r15a, r16a: 0.1 to 4.0 mm.

The receiving cap 12 and receiving ratchet 11 have an appropriate elastic force, the friction resistance and strength required to function as designed, and it is preferred that they be made from a material based on polycarbonate that is suitable for molding. Further, the same effect can be obtained with another plastic or metal as long as the material satisfies the above requirements.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A supply device for conveying a tape, said tape including a covering tape and a carrying tape holding electronic components in cavities formed at specific pitch on the caring tape, said covering tape covering said carrying tape, said supply device comprising:

a feed lever for conveying said tape;

a peeling member for peeling said covering tape from said carrying tape;

a removing member for removing said electronic components from said holding cavities at a component removal location;

a reel for receiving said covering tape removed by said peeling member, said reel having a receiving ratchet rotated in only one direction by a reciprocating action of the feed lever, having a first contact member having a first surface shape; and a receiving cap for receiving said covering tape, having a second contact member having a second surface shape, said receiving cap being detachably mounted on said receiving ratchet at an area of engagement; wherein said first and said second contact members are provided at the area of engagement and make contact in a direction of rotation and are one of convex and concave shapes that make mutual contact along the direction of rotation.

2. The supply device according to claim 1 wherein the convex and concave shapes on the surfaces of the contact members have a height and a depth of in the range of from 0.1 to 1.5 mm, respectively.

3. The electronic component supply device according to claim 1, wherein said convex and concave shapes include a boss and a dent, said convex and concave shape are substantially circular and are formed with a respective radius in the range of from 0.1 to 60 mm.

4. A supply device comprising:

a feed lever for conveying a tape and connecting to said supply device, said tape including a covering tape and a carrying tape holding electronic components in cavities formed at a specific pitch on the carrying tape, said covering tape covering said carrying tape;

a peeling member for peeling said covering tape and connecting to said supply device;

a removing member for removing said electronic components from said holding cavities at a component removal location and connecting to said supply device;

a reel for receiving said covering tape removed by said peeling member, having a receiving ratchet rotated in only one direction by the reciprocating action of the feed lever, having a first contact member having a surface shape, and connecting to said supply device;

a receiving cap for receiving said covering tape having a second contact member having a surface shape said receiving cap being detachably mounted on said receiving ratchet at an area of engagement;

wherein one of the first contact member and the second contact member is a circular boss and the other of the first contact member and the second contact member is a circular dent shaped in conformity with the circular boss, so that when the contact members are engaged with each other the circular boss fits into the circular dent.

* * * * *